United States Patent [19]

Suzuki et al.

[11] 4,096,522
[45] Jun. 20, 1978

[54] MONOLITHIC SEMICONDUCTOR MASK PROGRAMMABLE ROM AND A METHOD FOR MANUFACTURING THE SAME

[75] Inventors: Yasoji Suzuki, Kanagawa; Kenshi Manabe, Yokohama, both of Japan

[73] Assignee: Tokyo Shibaura Electric Co., Ltd., Kawasaki, Japan

[21] Appl. No.: 822,657

[22] Filed: Aug. 8, 1977

Related U.S. Application Data

[63] Continuation of Ser. No. 616,626, Sep. 25, 1975, abandoned.

[30] Foreign Application Priority Data

Sep. 26, 1974 Japan .................................. 49-110032

[51] Int. Cl.$^2$ ............................................. H01L 29/78
[52] U.S. Cl. ........................................ 357/45; 357/23; 357/41; 357/42
[58] Field of Search ........................ 357/23, 41, 42, 45

[56] References Cited

U.S. PATENT DOCUMENTS

3,959,025  5/1976  Polinsky .................................. 357/23

OTHER PUBLICATIONS

IBM Tech. Bul., vol. 15, No. 9, pp. 2919-2920, Feb. 1973, R. Knepper.

*Primary Examiner*—Edward J. Wojciechowicz

*Attorney, Agent, or Firm*—Oblon, Fisher, Spivak, McClelland & Maier

[57] ABSTRACT

A ROM with a matrix array of insulated gate enhancement type field effect transistors in each of which any information is not yet written is preliminarily prepared by a plurality of strip-shape diffusion regions doped at a predetermined interval in a given conductivity type semiconductor substrate and having a conductivity type opposite to that of the substrate, a plurality of strip-shape electroconductive metal layers formed through a first relatively thick insulation layer on the substrate at a predetermined interval so as to intersect the respective diffusion regions; and a plurality of gate electrode foils each formed through a second insulation layer thinner than the first insulation layer on that surface portion of the substrate which positions between the corresponding mutually facing ones of the diffusion regions so as integrally to project from the corresponding one of the electroconductive metal layers. An impression of information or absence thereof is controlled over the respective field effect transistors at the matrix intersections of the ROM by selectively implanting an impurity of the same conductivity type as that of the diffusion regions in the substrate through those exposed surface portions of the second insulation layer which are disposed between each of the gate electrode foils and the corresponding mutually facing ones of the diffusion regions, thereby providing an improved monolithic semiconductor mask programmable ROM and a method for manufacturing the same.

4 Claims, 27 Drawing Figures

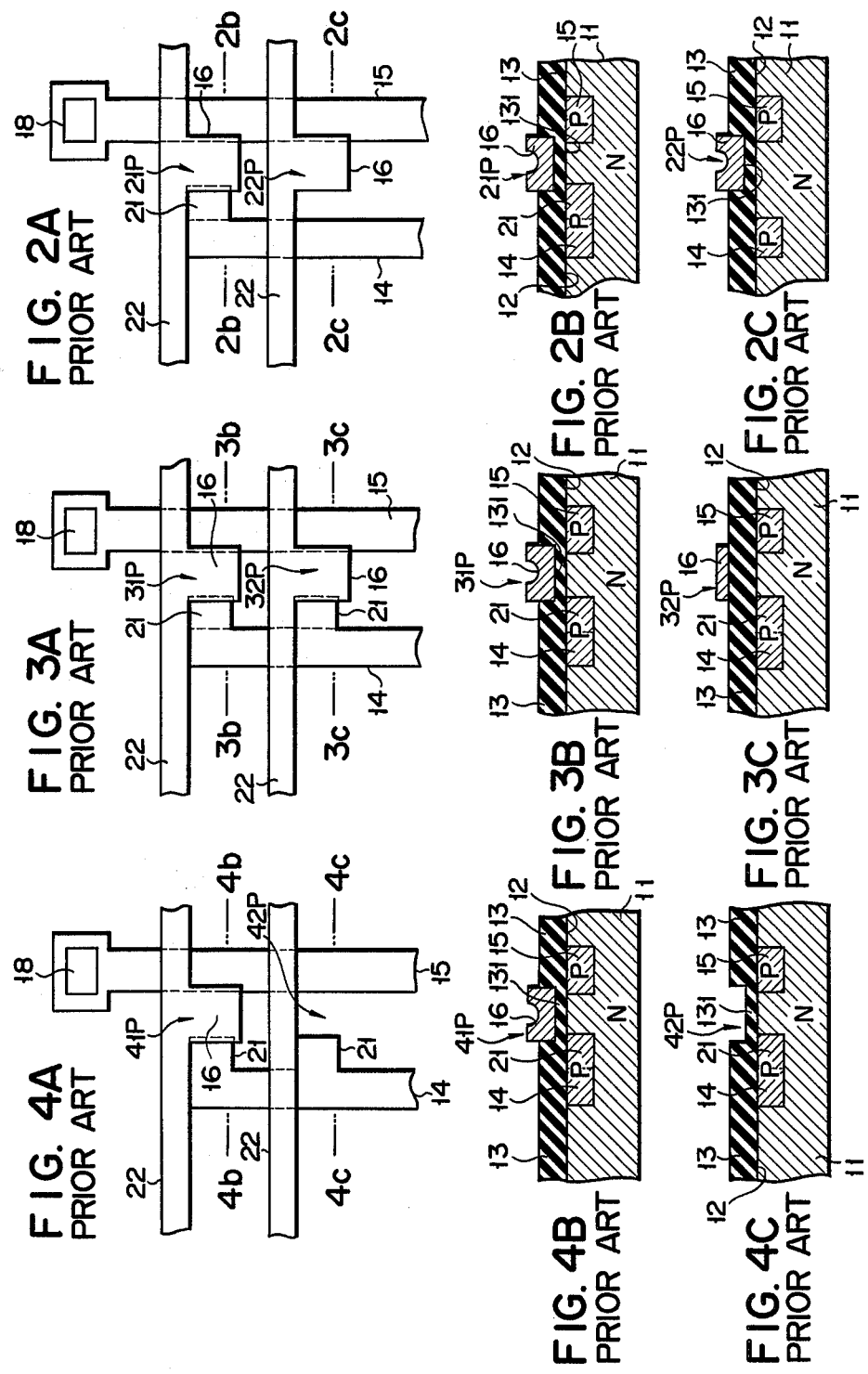

MONOLITHIC SEMICONDUCTOR MASK PROGRAMMABLE ROM AND A METHOD FOR MANUFACTURING THE SAME

This is a continuation, of application Ser. No. 616,626, filed Sept. 25, 1975, now abandoned.

This invention relates to an improved semiconductor mash programmable ROM (read only memory), and method for manufacturing the same, which includes a large number of semiconductor elements, more particularly, a matrix array of insulated gate enhancement type field effect transistors (hereinafter referred to as IGFET's) on a monolithic semiconductor substrate.

A recent design requirement for a very complex, diversified electronic circuit, aided by a marked improvement of a semiconductor integrated circuit technique, has increased an eager demand for very large capacity ROM's. As well known in this field, the ROM finds a wide variety of applications, for example, as peripheral devices for electronic computers, as added function circuits for tabletop calculators and for various code converters. Therefore, a different information pattern is required to be written in the ROM's in accordance with the individual intended uses thereof. A variety of ROM's can be separately manufactured according to each use intended on the user's side, but this method suffers the disadvantages that there is no interchangeability of one ROM with respect to another and that no mass production of ROM's can be attained at low costs, which is a striking feature inherent to the ROM manufacture.

A most effective solution to this problem, another method for manufacturing ROM's has recently been developed, which comprises the steps of (1) preparing a very large capacity (usually 2 to 4k bits) ROM preliminarily processed up to a manufacturing stage common to a variety of uses intended therefor and (2) selectively writing information in the matrix-arranged IGFET's constituting the ROM in accordance with a memory pattern of a ROM demanded from a user, by utilizing the later described programmable mask which differs according to uses intended for various ROM's. It should be noted that the expression "impression of information or absence thereof on a IGFET" disclosed herein denotes the necessity of indicating whether or not a matrix array of IGFET's arranged as hereinafter mentioned on a semiconductor substrate should be formed electrically and physically in a complete state, and in consequence whether or not each of the IGFET's should be made conductive by forming a conductive channel between its source and drain regions, upon application of appropriate DC voltages to its gate, source and drain electrodes. The key point of the above-mentioned mask programmable ROM is the earliest possible delivery of said ROM from the maker to a user after receiving an order from the latter, that is, the process of defining that of the masks used in the various stages of manufacturing the IGFET's which should be changed in order to write the selected one of the pieces of information varying with the applications required by the user. A conventional process necessary for the manufacture of IGFET's will now be explained briefly by referring to FIGS. 1A to 1F.

The process for manufacturing IGFET's is generally separated into the following steps:

(a) a relatively thick $SiO_2$ layer 13 of, e.g., about 7000 A is first formed by oxidizing one surface 12 of a semiconductor substrate of one conductivity type, e.g., an N-type silicon substrate 11. Under this condition, a predetermined portion of the $SiO_2$ layer 13 is removed using a first photoetching resist mask, and an impurity opposite in conductivity type to the silicon substrate 11, i.e. a P-type impurity, is doped into the exposed surface of the silicon substrate to form source and drain regions 14 and 15, as shown in FIG. 1A.

(b) The surface of the resultant silicon substrate structure is again oxidized as shown in FIG. 1B to form the $SiO_2$ layer 13 on the whole surface 12 of the substrate 11 which includes the exposed surface portions of the source and drain regions 14 and 15.

(c) The portion of the $SiO_2$ layer 13 defined between the source and drain regions 14 and 15 is removed through a second photoetching resist mask, as shown in FIG. 1C, to provide an opening for a gate electrode terminating at the surface 12 of the substrate 11.

(d) The surface of the resultant silicon substrate structure is again oxidized, as shown in FIG. 1D, to form a relatively thin gate oxide layer 131 of, e.g., about 1200 A on the exposed surface of the substrate.

(e) The $SiO_2$ layer 13 is selectively removed, as shown in FIG. 1E, through a third photoetching resist mask to expose those surface portions 121 and 122, as shown in FIG. 1F, of the substrate which substantially correspond to the source and drain regions 14 and 15, respectively.

(f) Preselcted electroconductie metals such as aluminum are vapor deposited, as shown in FIG. 1F, through a fourth photoetching resist mask on the gate oxide layer 131 and on the exposed surface portions 121 and 122 of the substrate, to provide a gate electrode 16, source electrode 17 and drain electrode 18.

(g) A phosphor- or boron-glass layer is formed by a chemical vapor deposition method on the whole surface of the resultant IGFET structure as obtained by the above-mentioned steps (a) to (f), so as to passivate the surface of the structure.

It will be evident from the above-mentioned manufacturing process that, as a masking step capable of easy information write-in control, the following three masking steps are considered: (1) the masking step for the formation of the source and drain diffused regions as shown in FIG. 1A, (2) the masking step for the formation of a gate electrode opening as shown in FIG. 1C; and (3) the masking step for the formation of the gate, source and drain electrodes as shown in FIG. 1F. Since the source and drain regions of such a ROM are generally shared by a number of IGFET's, each, arranged at the matrix intersection of the ROM as will be explained later, it is practically impossible to control impression of information or absence thereof on IGFET's constituting the ROM by the masking step for the formation of the source and drain electrode openings as shown in FIG. 1E.

In the conventional method for the manufacture of a mask programmable ROM with IGFET's, impression of information or absence thereof has been controlled over the IGFET's by modifying either one of the above-mentioned three masking steps according to the use intended, as will be explained later.

FIGS. 2A, 2B and 2C are a plan view and cross-sectional views, respectively, diagrammatically showing only a one-bit information bearing P-channel (this can be replaced by N-channel) IGFET 21P and one-bit P-channel IGFET 22P free from information of a conventional mask programmable ROM manufactured by modifying the masking step (FIG. 1A) for the formation of the source and drain regions. When, in the manufacture of such a ROM, strip-like P-type source and drain regions 14 and 15 are doped at a predetermined interval in an N-type silicon substrate 11, an additional diffused region 21 is formed (see FIG. 2B) integral with the source region 14 (this can be replaced by the drain region 15) of the IGFET 21P in which information is to be written in accordance with the use intended so as to extend a predetermined length toward the drain region 15. On the other hand, no additional diffusion section 21 is formed integral with the source region 14 of the IGFET 22P free from information. After the completion of the diffusion step, the various steps as shown in FIGS. 1B and 1E are conducted. In the evaporation step as shown in FIG. 1F, a plurality of strip-like elctroconductive metal layers 22 made of, e.g., aluminum are so formed at a predetermined interval on a relatively thick insulation layer 13 of about 7000 A so as to intersect the strip-like source and drain regions 14 and 15; and gate electrode foils 16 are so vapor deposited on a relatively thin gate insulation layer 131 of about 1200 A as to extend integrally with the corresponding one of the electroconductive metal layers 22. In this case, the gate electrode foil 16 of the information carrying IGFET 21P overlaps, at its opposite sides, on the additional source region 21 and the drain region 15 (FIG. 2B), while that of IGFET 22P free from information is formed between the source and drain regions 14 and 15 so that its one side only is overlapped with respect to the drain region 15, with the other side of the gate electrode foil 16 spaced at a predetermined amount from the source region 14 (FIG. 2C). A phosphor- and boron-glass layer (not shown) is vapor deposited on the surface of the IGFET structure to passivate the entire surface of the structure. When DC voltages of predetermined magnitudes are applied between the source electrode foil 17, drain electrode foil 18 and electroconductive metal layer 22 integral with the gate electrode foil 16 at each of IGFET's arranged in a matrix array of the resultant ROM, a conductive channel is formed between the source and drain regions 14 and 15 in each of the additional source region bearing IGFET's 21P to render conductive, while on the other hand a conduction channel is not substantially formed between the source and drain regions 14 and 15 in each of the remaining IGFET's 22lP to keep it nonconductive, thereby obtaining a desired ROM.

However, the mask programmable RO, manufactured as shown in FIGS. 2A and 2C has the disadvantage that a greater length of time will be required from the receipt of an order to the delivery of an article, since the masking step for control impression of information or absence thereof on the IGFET's is conducted at the first stage (i.e. the diffusion step for the formation of the source and drain regions) of the IGFET manufacturing process (FIGS. 1A to 1F). In this case it should be noted that, since the strip-like source and drain diffusion regions are shared by a plurality of IGFET's, it obviates the necessity of forming an individual opening with respect to each of the source and drain regions in each of the IGFET's i.e. a single opening has only to be provided in one end portion of each of the strip-like source and drain regions 14 and 15 so as to make electrical connection with the source and drain electrodes and this step is followed by an evaporation step for forming the source and drain electrode foils 17 and 18 together with the gate electrode foil 16.

FIGS. 3A, 3B and 3C are a plan view and cross-sectional views, respectively, diagrammatically showing only a one bit information bearing P-channel IGFET 31P and a one-bit P-channel IGFET 32P free from information of a conventional mask programmable ROM manufactured by modifying the masking step (FIG. 1C) for the formation of a gate electrode foil.

In this case, strip-like P-type drain regions 15 and source regions 14 with an additional region 21 are diffused at a predetermined interval in one surface 12 of an N-type silicon substrate 11 as shown in FIG. 1A, and a relatively thick SiO$_2$ layer 13 of about 7000 A is formed, as shown in FIG. 1B, on the entire surface of the structure. These steps are effected before the receipt of an order from the user.

Upon receipt of an order from the user, an opening is perforated in that portion of the SiO$_2$ layer 13 on which a gate electrode foil of each IGFET in which information is to be written is to be deposited according to the user's intention and any hole is not provided for each IGFET free from information (FIG. 1C). As shown in FIG. 1D, a relatively thin SiO$_2$ layer 131 of about 1200 A is formed on each exposed portion of the silicon substrate 11 which corresponds to the opening on which the gate electrode foil 16 is provided. Then, a hole is provided on which each of source and drain electrode foils is to be deposited. As shown in FIG. 1F, a plurality of strip-like electroconductive metal layers 22 made of, for example, aluminum are vapor deposited at a predetermined interval on a relatively thick insulation layer 13 of about 7000 A so as to intersect the strip-like source and drain regions 14 and 15, and a gate electrode foil 16 is vapor deposited on a relatively thin gate oxide layer 131 (FIG. 3B) of about 1200 A corresponding to each information bearing IGFET and on a relatively thick gate oxide layer 13 (FIG. 3C) of about 7000 A corresponding to each IGFET free from information, so as to extend integrally with the corresponding one of the electroconductive metal layers 22. The source and drain electrode foils 17 and 18 are deposited together with the gate electrode foils 16. Then, a phosphor- or boron-blass layer is vapor deposited on the entire surface of the IGFET structure to passivate the surface.

When voltages of predetermined magnitudes are applied between the source electrode foils 17, drain electrode foils 18 and the electroconductive metal layers 22 integral with the gate electrode foils 16, a conductive channel is created between the source and drain regions 14 and 15 of the IGFET's 21P whose the gate electrode foils are each formed on the relatively thin gate oxide layer 131 of about 1200 A to render the IGFET's 21P conductive. On the other hand, a conduction channel is not substantially established between the source and drain regions 14 and 15 of the IGFET's 22P whose gate electrode foils 16 are each formed on the relatively thick oxide layer 13 of about 7000 A to make the IGFET's 22P nonconductive, whereby a desired ROM is obtained.

In the mask programmable ROM of FIGS. 3A and 3C, the masking step for controlling impression of information or absence thereof on the matrix arranged IGFET's is effected by process for perforating the respective gate electrode openings substantially at the middle (FIG. 1C) of the IGFET manufacturing process as shown in FIGS. 1A to 1F. Indeed, this method can attain a more considerable reduction of manufacturing time required for delivery of the ROM from the maker to a user after receiving an order from the latter than in the mask programmable ROM of FIGS. 2A to 2C, but it still requires after receiving the order from the user, the steps as shown in FIGS. 1D and 1F as well as the surface passavation step. Therefoe, a lengthy period of time will be required from the receipt of the user's order to the delivery of the article. This method admits of controlling impression of information or absence thereof on the entire IGFET's constituting the ROM by selectively varying the thickness of the respective gate oxide layers of the IGFET's so as to make the IGFET's 22P free from information somewhat higher in threshold voltage than the information bearing IGFET's 21P. However, in this method, a small leak current exists between the respective source and drain regions of the IGFET's 22P free from information.

FIGS. 4A, 4B and 4C are a plan view and cross-sectional views, respectively, diagrammatically showing only a one-bit information carrying P-channel IGFET 41P and a one-bit P-channel IGFET 42P free from information of a conventional mask programmable ROM manufactured by modifying the masking step (FIG. 1F) for vapor depositing the respective gate, source and drain electrode foils of matrix-arranged IGFET's constituting a ROM in order to control impression of information or absence thereof on each of the IGFET's. In this method, the manufacturing process for the formation of the mask programmable ROM has been advanced, before receipt of an order from a user, from the step for forming a plurality of strip-like P-type drain diffused regions 15 and strip-like P-type source diffused regions 14 each having an additional diffused region 21 in an N-type silicon substrate 11 at a predetermined interval as shown in FIG. 1A up to the step for perforating gate electrode openings of respective IGFET's as shown in FIG. 1E. Upon receipt of the user's order, a plurality of strip-like electroconductive metal layers 22 are vapor deposited at a predetermined interval on a relatively thick insulation layer 13 of about 7000 A so as to intersect the strip-like source and drain regions 14 and 15. At the same time, a gate electrode foil 16 is vapor deposited on the gate oxide layer 131 corresponding to the information bearing IGFET 41P so as to extend integrally with the corresponding strip-like metal layer 22. On the other hand, no gate electrode foil 16 is vapor deposited on the gate oxide layer 131 corresponding to the IGFET 42P free from information. The vapor deposition of the gate electrode foil 16 is effected simultaneously with the vapor deposition of source and drain electrode foils 17 and 18. Then, a phosphor- or boron-glass layer is vapor deposited on the entire surface of the ROM structure to passivate the surface.

In this method, the masking step for controlling impression of information or absence thereof on the matrix arranged IGFET's constituting the ROM is conducted at a nearly final stage (FIG. 1F) for providing gate, source and drain electrode foils of the IFGET's of the ROM manufacturing process. For this reason, it is possible to further reduce a time required for the manufacture of a mask programmable ROM after receipt of an order from the user as compared with the method shown in FIGS. 3A to 3C. Since in this method, however, impression of information or absence thereof is controlled on the IGFET's by the selective formation of the gate electrode foils on the relatively thin oxide layer 131 of about 1200 A, there is still a possibility that a small leak current will flow between the source and drain regions of the respective IGFET's free from information as in the case of the method shown in FIGS. 3A to 3C.

It is accordingly the object of this invention to provide a monolithic mask programmable ROM with excellent electrical characteristics, and a method for manufacturing the same, which is capable of reducing to a practically possible extent a time required from the receipt of an order from a user until it can be delivered to the user.

A monlithic mask programmable ROM according to one embodiment of this invention is characterized in that matrix-arranged insulated gate enhance type field effect transistors constituting the ROM in which any information is not yet written comprises a semiconductor substrate of one conductivity type, a plurality of strip-like source and drain diffusion regions formed at a predetermined interval in the substrate and having a conductivity type opposite to that of the substrate, a plurality of strip-like electroconductive metal layers formed through a first relatively thick insulation layer on the substrate so as to intersect the diffusion regions at a predetermined interval, and gate electrode foils each of which is formed through a second insulation layer at least thinner than the first insulation layer on a portion of the substrate situated between the corresponding source and drain diffusion regions so that it extends integrally with the corresponding one of the electroconductive metal layers with at least one side thereof spaced at a predetermined amount from one of the corresponding source and drain diffusion regions, and means for impression of information or absence thereof on the respective field effect transistors comprises an impurity having the same conductivity type as that of the source and drain diffusion regions and being selectively implanted into the substrate through those exposed surface portions of said second insulation layer which are situated between the respective gate electrode foils and the source diffusion regions as well as the drain diffusion regions.

According to this invention, the process for the formation of a mask programmable ROM can be advanced, before the receipt of a user's order, from the step for forming the source and drain diffusion regions of the respective IGFET's as shown in FIG. 1A up to the step for providing the respective gate source and drain electrode foils of the IGFET's as shown in FIG. 1F. Upon receipt of an order from the user, it is only necessary that an impurity of the same conductivity type as that of the source and drain diffusion regions be selectively implanted, in accordance with the user's intention, into the substrate through those exposed surface portions of the second insulation layer which are situated between each gate electrode foil and the corresponding mutually facing ones of the respective source and drain diffusion regions, and then a phosphor- or boron-glass layer is vapor deposited on the entire surface of the IGFET structure to passivate the surface of the same structure.

According to this invention, a manufacturing time required from the receipt of an order for ROM's to the delivery of the ROM's can be further reduced as compared with the conventional method as shown in FIGS. 4A to 4C. Furthermore, since a least one of the respective mutually facing source and drain diffusion regions is so formed that it is spaced at an appropriate amount from the corresponding gate elctrode foil through the second insulation layer, there is much less chance of a leak current as occuring between the source and drain regions of the respective IGFET's free from information as being observed by the conventional ROM structure as shown in FIGS. 3A and 3C and 4A to 4C.

In another aspect of this invention, an impurity opposite in conductivity type to that of the source and drain diffusion regions is implanted into the substrate through those exposed surface portions of the second insulation layer which are disposed between the gate electrode foil and drain diffusion region as well as source diffusion region of each of the IGFET's free from information. In this case, it is possible to positively eliminate any leak current as occurring between the source and drain regions of each IGFET free from information.

This invention will further be described by way of example by referring to the accompanying drawings in which FIGS. 1A to 1F are cross-sectional views showing the steps for manufacturing an IGFET;

FIG. 2A is a plan view diagrammatically showing, by way of example, only a one-bit information bearing IGFET and a one-bit IGFET free from information of a conventional mask programmable ROM;

FIG. 2B is a cross-sectional view as taken along line 2b—2b in FIG. 2A;

FIG. 2C is a cross-sectional view as taken along line 2c—2c in FIG. 2A;

FIG. 3A is a plan view diagrammatically showing by way of example only a one-bit information carrying IGFET and a one-bit IGFET free from information of another conventional mask programmable ROM;

FIG. 3B is a cross-sectional view as taken along line 3b—3b in FIG. 3A;

FIG. 3C is a cross-sectional view as taken along line 3c—3c in FIG. 3A;

FIG. 4A is a plan view diagrammatically showing by way of example only a one-bit information bearing IGFET and a one-bit IGFET free from information of a still another conventional mask programmable ROM;

FIG. 4B is a cross-sectional view as taken along line 4b—4b in FIG. 4A;

FIG. 4C is a cross-sectional view as taken along line 4c—4c in FIG. 4A;

The preferred embodiments of a monolithic mask programmable ROM according to the present invention will now be described with reference to FIGS. 5A to 10C.

Figure 5A:
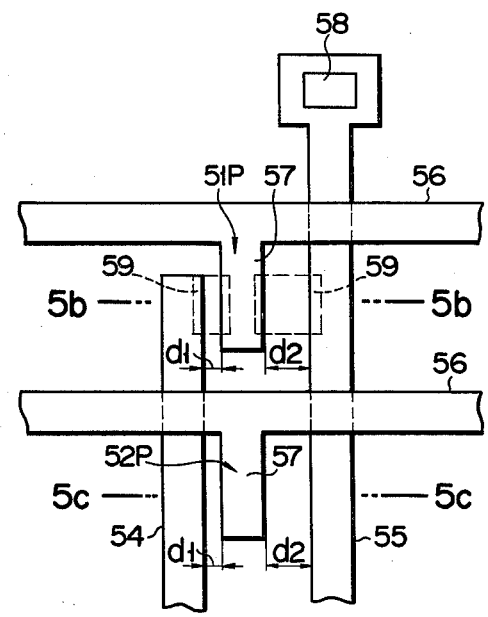
FIG. 5A is a plan view schematically showing by way of example only a one-bit information bearing IGFET and a one-bit IGFET free from information of a monolithic mask programmable ROM according to one embodiment to one embodiment of this invention.
Figure 5B:
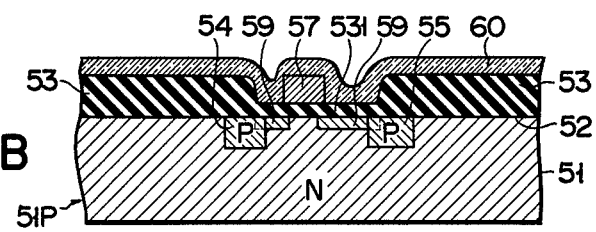
FIG. 5B is a cross-sectional view as taken along line 5b—5b in FIG. 5A.
Figure 5C:
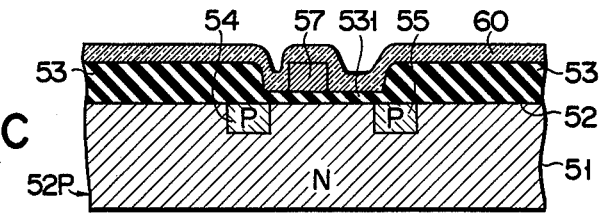
FIG. 5C is a cross-sectional view as taken along line 5c—5c in FIG. 5A.

FIGS. 5A, 5B and 5C are a schematic plan and cross-sectional views only showing a one-bit information bearing IGFET 51P and a one-bit IGFET 52P free from information.

Figure 1A:
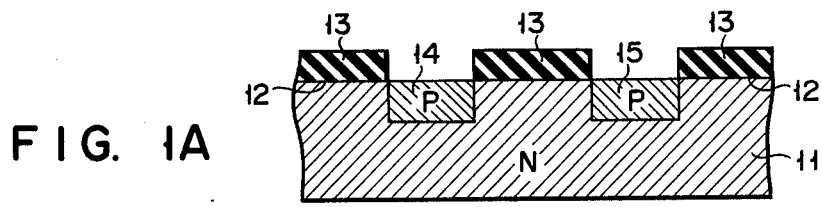

With the monolithic mask programmable ROM of this embodiment, the following ones of the various steps of manufacturing the ROM should be carried out prior to receipt of an order from a user;

(a) One surface 52 of a given conductivity type monolithic semiconductor substrate, e.g., an N-type silicon substrate 51 is first oxidized to form a relatively thick $SiO_2$ layer 53 of, e.g., about 7000 A on the whole substrate surface 51. Then, a predetermined portion of the $SiO_2$ layer 53 is removed utilizing a first photoetching resist mask. At the same time, an opposite impurity to that of the substrate 51, i.e. a P-type impurity such as a boron is doped into the substrate 51 through the removed portions of the $SiO_2$ layer 53 to form a plurality of P-type strip-shape source diffused regions 54 and drain diffused regions 55 each having a predetermined width of, e.g. about 6 to 8 $\mu$m at a predetermined interval of, e.g., about 20 to 30 $\mu$m (FIG. 1A). The source and drain diffused regions 54 and 55 are used in common to some of the P-channel IGFET's disposed at the intersections on the substrate 1 of the matrix-arranged memory addresses of the ROM.

Figure 1B:
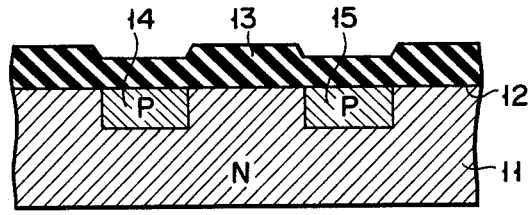

(b) The surface 52 of the substrate 51 is again oxidized to cover, by the $SiO_2$ layer 53 of about 7000 A, the whole substrate surface 51 including the exposed portions of the respective source and drain diffused regions 54 and 55 (FIG. 1B).

Figure 1C:
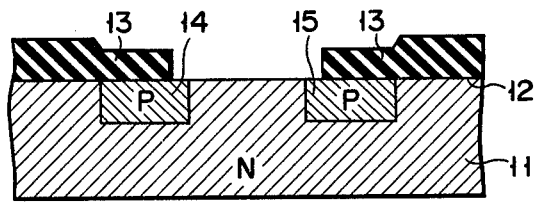

(c) An opening or hole is perforated, utilizing a second photoetching resist mask, by removing that substrate surface portion of the $SiO_2$ layer 53 which is positioned between the mutually adjacent ones of the respective source and drain regions 54 and 55 and on which the hereinafter described gate electrode foil 57 of each of the matrix-arranged IGFET's is provided (FIG. 1C).

Figure 1D:
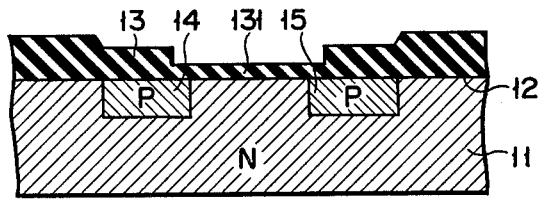

(d) The source 52 of the substrate 51 is again oxidized to form a relatively thin gate insulation $SiO_2$ layer 531 of, e.g. about 1200 to 1500 A on that surface portion of the substrate 51 at which the gateelectrode foil opening is perforated (FIG. 1D).

Figure 1E:
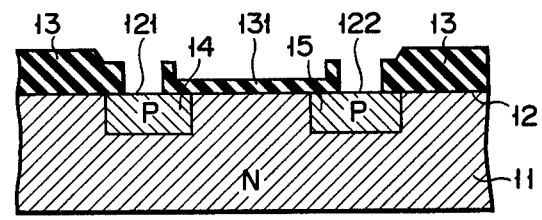

(e) Another opening is perforated, utilizing a third photoetching resist mask, by removing that substrate surface portion of the $SiO_2$ layer 53 which is situated at each one end of the respective source and drain diffused regions 54 and 55. (FIG. 1E).

(f) A plurality of electroconductive metal layers or foils 56 such as aluminum each having a predetermined width of, e.g. about 6 to 8 $\mu$m are vapor deposited, utilizing a fourth photoetching resist mask, on the $SiO_2$ layer 53 at a predetermined interval of, e.g. about 20 to 30 μm so as to intersect the source and drain regions 54 and 55. At the same time, gate electrode layers or foils 57 such as aluminum each having a predetermined length of, e.g. about 15 to 20 μm and width of, e.g. about 10 to 12 μm are vapor deposited on the gate insulation SiO$_2$ layer 531 so as integrally to project from the corresponding electroconductive metal layers 56 and so that the opposite side ends of each of the gate electrode foils 56 are each spaced at an appropriate distance $d1$ or $d2$ ($d1 \approx 2$ to 5 μm and $d2 \approx 2$ to 10 μm in this embodiment) from the inner wall of each of the corresponding mutually facing ones of the source and drain regions 54 and 55. At the same time, a source electrode layer (not shown) and a drain electrode layer 58 are further vapor deposited on each one end of the source and drain regions 54 and 55, whereby a plurality of P-channel IGFET's in which any information is not yet written are arranged at the matrix-intersections on the substrate 51 defined by the strip-shape source and drain diffused regions 54 and 55 and the strip-shape electroconductive metal foils 56. Thus, upon receipt of an order from a user, an impurity 59 having the same conductivity type (P-type in this embodiment) as the source and drain regions is implanted, utilizing a fifth photoetching resist mask prepared in accordance with the memory pattern of the ROM ordered from the user, into the substrate 51 through those exposed portions of the gate insulation SiO$_2$ layer 531 which are positioned at the spaces $d1$ and $d2$ defined by the electrode foil 57 of each of those of the matrix arranged P-channel IGFET's in which information is to be written and the corresponding mutually facing ones of the source and drain regions 54 and 55. Thereafter, a phosphorus- or boron-glass layer 60 is vapor deposited on the whole surface of the ROM to stabilize the surface.

With the ROM manufactured through the above-mentioned steps, the source and drain regions 54 and 55 of those 51P fo the matrix-arranged P-channel IGFET's in each of which is provided the implanted region 59 should respectively extend equivalently just below the corresponding gate electrode foils 57, whereas the source and drain regions 54 and 55 of the remaining IGFET's not provided with the implanted region 59 are spaced at the distances $d1$ and $d2$ respectively from the corresponding gate electrode foils 57. Therefore, upon application of predetermined DC voltages between the respective gate electrode foils 57, source electrode foils and drain electrode foils 58, the IGFET's 51P provided with the implanted region 59 are formed with conduction channels between their source and drain regions 54 and 55 and in consequence are made conductive, while the remaining IGFET's 52P not provided with the implanted region 59 are not formed with any conduction channel between their source and drain regions 54 and 55 and consequently are kept nonconductive, thereby obtaining the desired ROM.

Figure 1F:
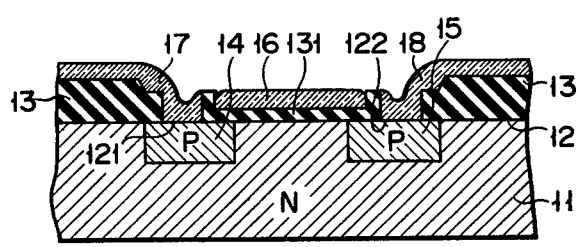

Among the aforesaid steps of manufacturing the IGFET's constituting the mask programmable ROM of this invention, the other steps than the surface stabilizing step which range from the source and drain region diffusing process up to the gate, drain and source electrode forming process as shown in FIGS. 1A and 1F can be carried out prior to receipt of an order from a user, i.e., before writing any required information in the IGFET's of the ROM.

Therefore, delivery of the mask programmable ROM of this invention from the maker to a user can be effected in a shorter time than in the case of the ROM of FIGS. 4A to 4C. If the distances $d1$ and $d2$ between each gate electrode foil 57 of the IGFET's and the corresponding source and drain regions 54 and 55 thereof are each previously chosen to have an appropriate value, then any leak current which might otherwise occur between the source and drain regions of each IGFET free from information can be easily eliminated.

Figure 5D:
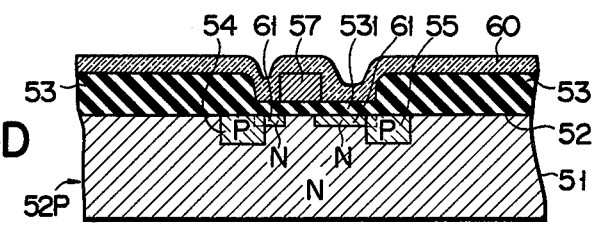
FIG. 5D is a cross-sectional view as taken along line 5c—5c in FIG. 5A showing a mask programmable ROM according to another embodiment of this invention.

FIG. 5D is a cross-sectional view taken along line 5c—5c of FIG. 5A in a mask programmable ROM according to another embodiment of this invention.

The ROM of this embodiment has substantially the same arrangement as that of the preceding embodiment, excepting that an impurity 61 of an opposite conductivity type (N-type impurity such as a phosphorus in this embodiment) to that of the source and drain regions 54 and 55 is implanted into the N-type silicon substrate 51 through those exposed portions of the gate insulation SiO$_2$ layer 531 which are defined by the aforesaid spaces $d1$ and $d2$ positioned between the gate electrode foil 57 of each of the IGFET's free from information and the corresponding source and drain regions 54 and 55.

The ROM constructed according to this embodiment has the advantage that an electric isolation between the source and drain regions 54 and 55 of each IGFET 52P free from information can be more improved than in the case of the ROM of the preceding embodiment.

It should be noted that two methods may be applied for forming the aforesaid implanted regions 59 and 61. One of them is the so-called diffusion method, and the other method the ion injection method.

However, the diffusion method requires a considerably long time (generally 2 to 3 hours) for forming the aforesaid implanted regions 59 and 61 and must be carried out at a high temperature of about 1100° C, as is well known to those skilled in the art. For this reason, the diffusion technique for forming the implanted regions 59 and 61 has the drawback that material such as aluminum having a lower melting point (about 500° C) than the diffusion temperature of about 1100° C cannot be used as electroconductive metal material for forming the electroconductive metal layers 56, gate, source and drain electrode foils of the IGFET's. Only electroconductive metal material such as molybdenum having a higher melting point than the aforesaid diffusion temperature can be used in the diffusion method. The diffusion method has another drawback that it disturbs a selfalignment between the gate electrode foils 57 of the IGFET's and the corresponding source and drain regions 54 and 55 thereof. Further, molybdenum tends to form an undesirable eutectic with silicon of the substrate material, as is well known in the art.

On the contrary, the ion injection method can form the implanted regions 59 and 61 in a much shorter time (generally about 10 minutes) than in the diffusion and at a normal temperature followed by annealing of about 500° C. Therefore, the ion injection method for forming the implanted regions 59 and 61 is advantageous in that it can use aluminum not forming eutectic with silicon of the substrate material as electroconductive metal material for the electroconductive metal layers 56, gate, source and drain electrode foils of the IGFET's, and does maintain selfalignment between the gate electrode foils 57 of the IGFET's and the corresponding source and drain regions 54 and 55 thereof.

Figure 6:
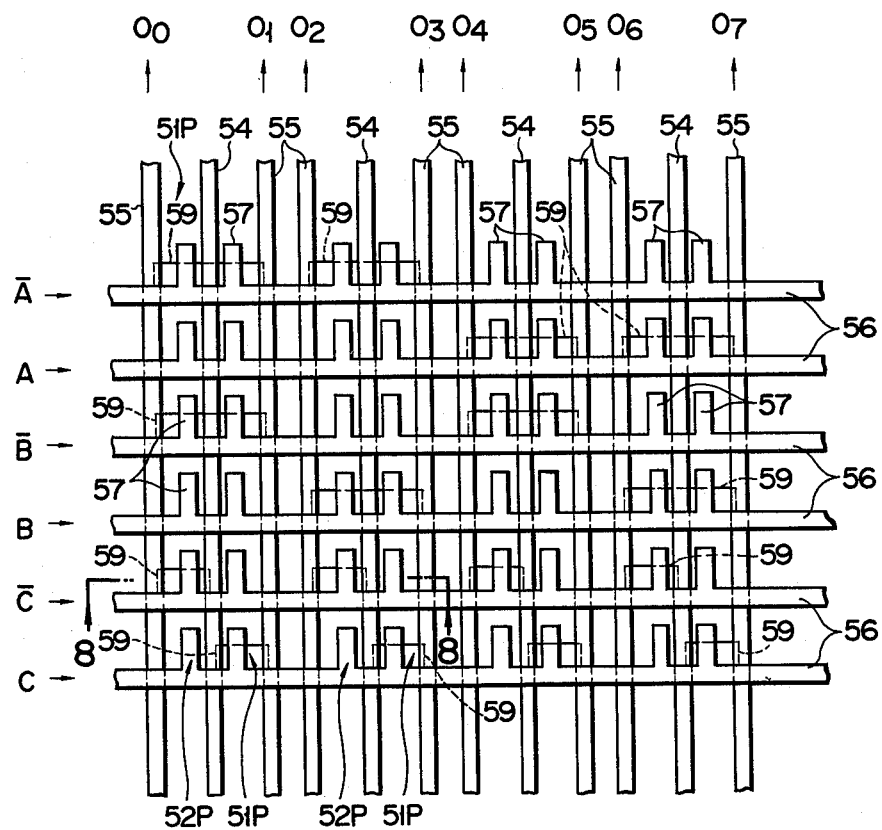
FIG. 6 shows a pattern layout schematically showing a main part of a 3 input-8 output decoder manufactured according to one embodiment of this invention.
Figure 7:
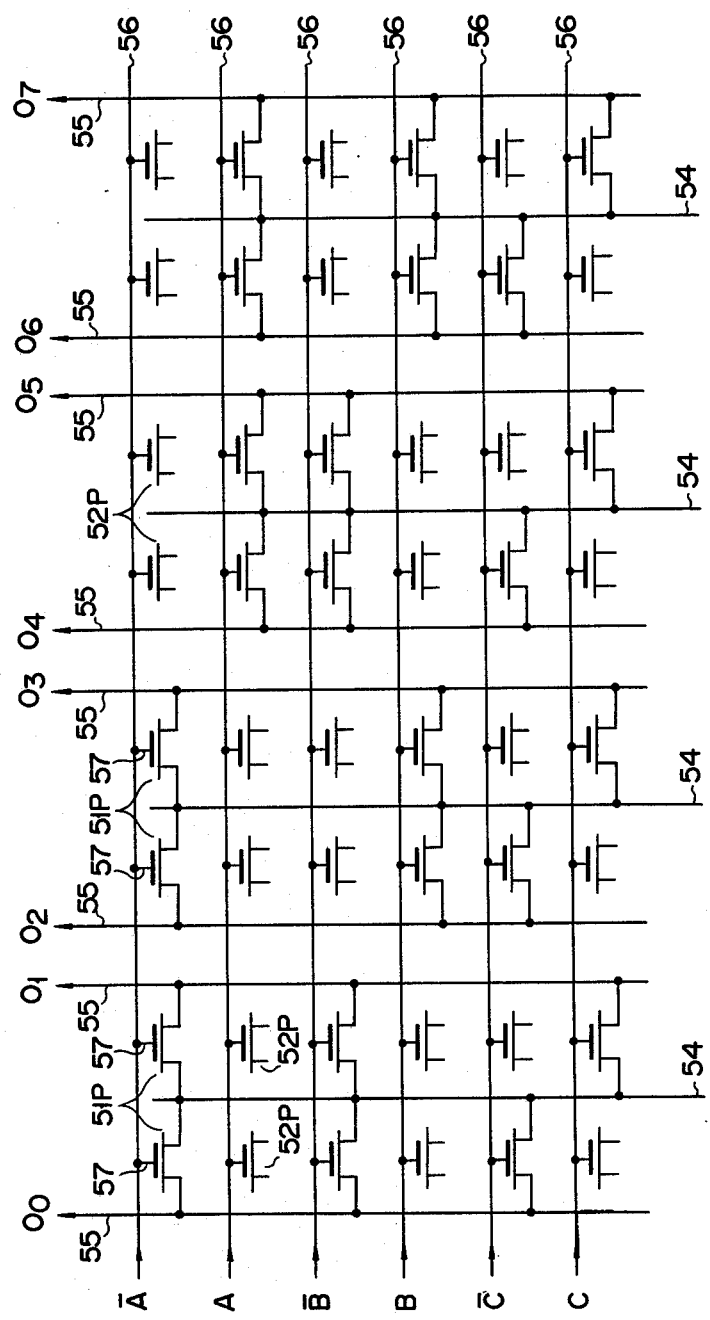
FIG. 7 shows an equivalent circuit of FIG. 6.
Figure 8A:
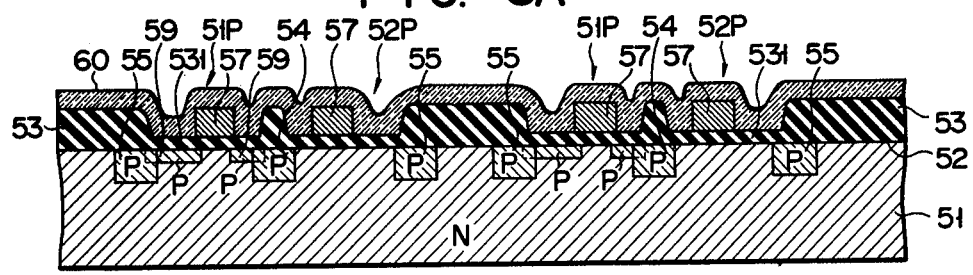
FIG. 8A is a cross-sectional view as taken along line 8—8 in FIG. 6.

FIG. 6 is a schematic plan view of a main part of the pattern layout of a conventional 3 complementary pairs of inputs (A—$\overline{A}$, B—$\overline{B}$ and C—$\overline{C}$)-to-8 output (O$_0$ to O₇) decoder 70 manufactured according to the above-mentioned first embodiment of this invention; FIG. 7 shows an equivalent circuit diagram of FIG. 6; and FIG. 8A is an enlarged cross-sectional view taken along line 8—8 of FIG. 6.

In the decoder 70, 48 (6 rows and 8 columns)-matrix-arranged P-channel IGFET's are constructed, before receipt of an order from a user (i.e., each IGFET without any information written), of 8-strip-shape drain regions 55 formed by doping, into a predetermined conductivity type semiconductor chip (e.g., an N-type silicon chip 51) from one surface 52 thereof, a P-type impurity of an opposite conductivity type to that of the silicon chip 51 at a predetermined interval; 4-strip-shape source regions 54 formed by doping the P-type impurity into the chip 51 from those surface portions thereof which are positioned substantially at the middle of each two adjacent ones of the drain regions 55; 6-strip-shape electroconductive metal layers 56 vapor-deposited at a predetermined interval on a relatively thick SiO₂ layer 53 of about 7000 A so as to intersect the source and drain regions 54 and 55; and rectangular gate electrode layers or foils 57 vapor-deposited on the above-mentioned relatively thin gate insulation SiO₂ layer 531 of about 1200 to 1500 A so as integrally to project from the corresponding electroconductive metal layers 56 respectively. (At the same time, source and drain electrode foils are provided at each end of the source and drain regions 54 and 55 as clear from the above description.)

Thus, impression of information or absence thereof on the 48 matrix-arranged IGFET's 51P and 52P in accordance with a required memory pattern of the decoder 70 can be attained by selectively implanting the same conductivity type impurity as the source and drain regions 54 and 55 into those of the whole IGFET's in each of which information is to be written in the above-mentioned manner.

The decoder 70 manufactured as mentioned above can act as a so-called 3 binary imputs-to-8 output decoder, as is well known to those skilled in the art, where the source electrode foils (not shown) are connected to a reference or grounded positive DC source terminal, the drain electrode foils (not shown) are connected through respective load resistors (not shown) to the corresponding outputs O₀ to O₇, and the electroconductive metal layers 56 are connected through one or two inverters (not shown) to the corresponding inputs A, $\overline{A}$, B, $\overline{B}$, C and $\overline{C}$.

Figure 8B:
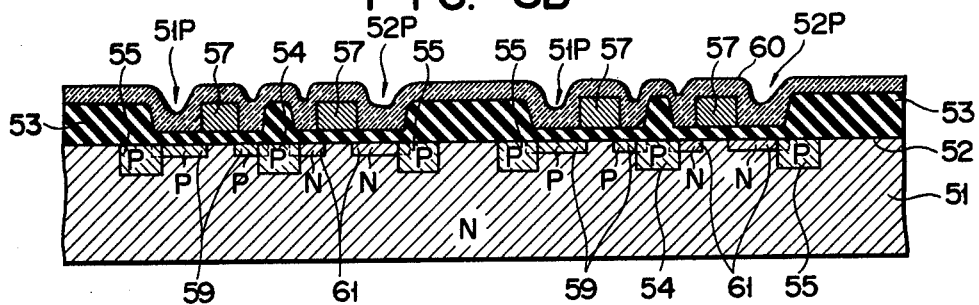
FIG. 8B is a cross-sectional view, similar to that of FIG. 8A, showing a major portion of a 3 input-8 output decoder

FIG. 8 is an enlarged cross-sectional view taken along line 8—8 of FIG. 6 in case the decoder 70 is manufactured according to the above-mentioned second embodiment (FIG. 5D) of this invention. The decoder 70 thus manufactured can more securely eliminate any leak current which might otherwise occur between the source and drain regions 54 and 55 of each IGFET 52P void of information, and in consequence it has the advantages of attaining the smallst possible power consumption and reading out the stored information in the decoder 70 at the highest possible accuracy.

A monolithic mask programmable ROM according to this invention has been particularly shown and described by reference to the preferred embodiments thereof, and it will be understood by those skilled in the art that various changes in form and details may be made therein without departing from the spirit and scope of this invention.

Figure 9:
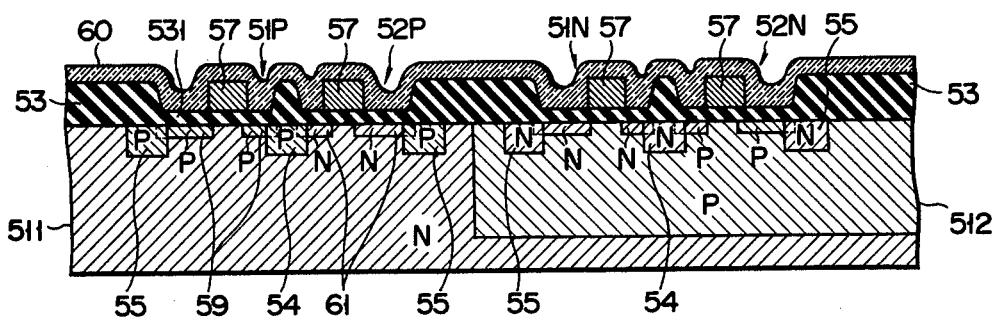
FIG. 9 is a cross-sectional view only showing one complementary pair of P- and N-channel IGFET's of a monolithic mask programmable ROM manufactured according to a still another embodiment of this invention.

For example, only a mask programmable ROM so constructed as to form a plurality of IGFET'of the same channel i.e., P-channel (permissibly N-channel) in an N-type (permissibly P-type) monolithic semiconductor substrate 51 has been disclosed in the above-mentioned embodiments. However, in the modification of FIG. 9, a P-type well 512 is formed by doping a P-type impurity into about one-half area of an N-type semiconductor substrate 511, a plurality of P-channel IGFET's (only two IGFET's 51P and 52P are shown in FIG. 9) being matrix-arranged in the remaining one-half N-type semiconductor substrate 511 and a plurality of N-channel IGFET's (only two IGFET's 51N and 52N are shown in FIG. 9) being matrix-arranged in the P-type well 512, in the same manner as the above-mentioned embodiments.

Further, in the aforesaid embodiments, the gate electrode foils 57 are each so formed as to be spaced at the distances d1 and d2 from the corresponding source and drain regions 54 and 55.

Figure 10A:
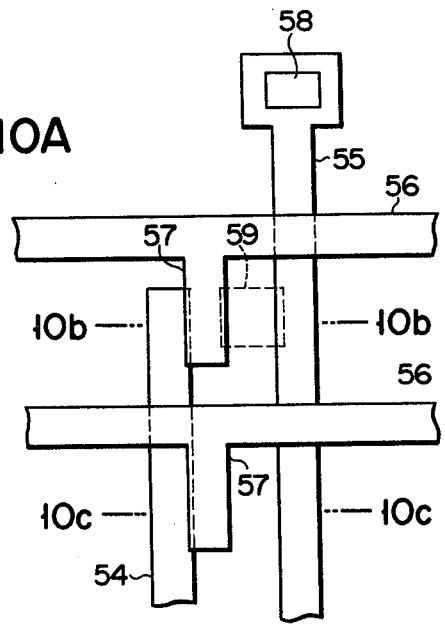
FIG. 10A is a plan view only showing a one-bit information carrying IGFET and a one-bit IGFET free from information of a monolithic mask programmable ROM according to a further embodiment of this invention.
Figure 10B:
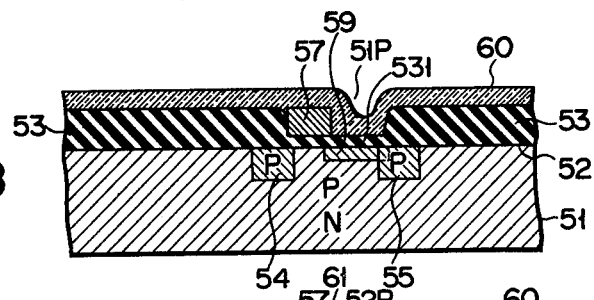
FIG. 10B is a cross-sectional view as taken along line 10b—10b in FIG. 10A.
Figure 10C:
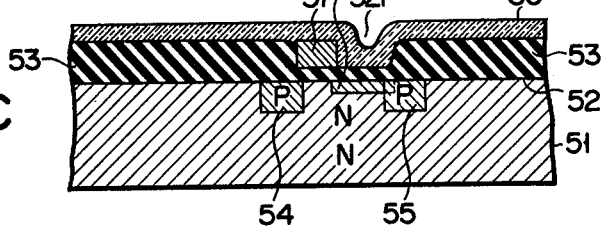
FIG. 10C is a cross-sectional view as taken along line 10c—10c in FIG. 10A.

However, in the modification of FIGS. 10A to 10C, the gate electrode foils 57 are each spaced at the distance d2 from any one (e.g., the drain region 55) of the corresponding source and drain regions 54 and 55 in the same manner as in the aforesaid embodiments, but they are each overlapped on the other source region 54.

It will be apparent that a monolithic mask programmable ROM manufactured in accordance with the modification of FIG. 9 or FIGS. 10A to 10C can attain substantially the same effect as in the above-mentioned embodiments.

The parts of FIGS. 6 to 10C corresponding to those of FIGS. 5A and 5C are denoted by the corresponding symbols, and the description thereof is omitted.

What we claim is:

1. A monolithic semiconductor mask programmable ROM conprising a matrix array of field effect transistors of insulated gate enhancement type, characterized in that the respective field effect transistors include a semiconductor substrate of one conductivity type, a plurality of strip-like source and drain diffusion regions formed at predetermined intervals in said substrate and having the opposite conductivity type, a plurality of strip-like electroconductive metal layers formed at predetermined intervals through a first relatively thick insulation layer on said substrate so as to intersect said source and drain diffusion regions, and a plurality of gate electrode foils, each gate electrode foil formed through a second insulation layer thinner than said first insulation layer on that portion of said substrate which is situated between the corresponding ones of said respective source and drain diffusion regions so that said gate electrode foil extends integrally with the corresponding one of said electroconductive metal layers with at least one side thereof spaced for a predetermined distance from one of said corresponding source and drain diffusion regions, wherein said field effect transistors are divided into first and second groups, the transistor of the first group being arranged at specific positions corresponding to the information written therein and the transistors of the second group being arranged at specific positions other than those occupied by the first field transistors, and each of said field effect transistors includes an ion implantated region formed beneath said second insulation layer between each gate electrode foil and at least one of the source and drain diffusion regions which are facing the gate electrode foil, the ion implantated regions of the first field effect transistors of the first group having the same conductivity type as said source and drain diffusion regions and the ion implantation regions of the field effect transistors of the second group having the conductivity type opposite to that of the source and drain diffusion regions.

2. A monolithic semiconductor mask programmable ROM according to claim 1, wherein said semiconductor substrate comprises a first substrate of one conductivity type and a second substrate formed by doping in said first substrate and having a conductivity type opposite to that of said first substrate; and said source and drain diffusion regions comprise first source and drain diffusion regions formed by doping in said first substrate and having an opposite conductivity type to that of said first substrate, and second source and drain diffusion regions formed by doping in said second substrate and having a conductivity type opposite to that of said second substrate, whereby a matrix array of P- and N-channel IGFET's is formed in said semiconductor substrate.

3. A monolithic semiconductor mask programmable ROM according to claim 1, wherein said gate electrode foils are each formed in a manner that each side thereof is spaced at a predetermined amount from the corresponding mutually facing ones of said source and drain diffusion regions.

4. A monolithic semiconductor mask programmable ROM according to claim 1, wherein said strip-like source and drain diffusion regions are so formed that one source diffusion region is interposed between two drain diffusion regions, whereby each source diffusion region is shared by said two drain diffusion regions.

* * * * *